(12) United States Patent
Sawabe et al.

(10) Patent No.: US 10,304,849 B2
(45) Date of Patent: May 28, 2019

(54) SEMICONDUCTOR MEMORY DEVICE

(71) Applicant: Toshiba Memory Corporation, Minato-ku (JP)

(72) Inventors: Ryosuke Sawabe, Yokkaichi (JP); Masaru Kito, Kuwana (JP)

(73) Assignee: Toshiba Memory Corporation, Minato-ku (JP)

( * ) Notice: Subject to any disclaimer, the term of this patent is extended or adjusted under 35 U.S.C. 154(b) by 28 days.

(21) Appl. No.: 14/960,888

(22) Filed: Dec. 7, 2015

(65) Prior Publication Data

US 2017/0077119 A1    Mar. 16, 2017

Related U.S. Application Data

(60) Provisional application No. 62/216,564, filed on Sep. 10, 2015.

(51) Int. Cl.
| | |
|---|---|
| *H01L 29/76* | (2006.01) |
| *H01L 27/11582* | (2017.01) |
| *H01L 27/11565* | (2017.01) |
| *H01L 27/1157* | (2017.01) |

(52) U.S. Cl.
CPC .... *H01L 27/11582* (2013.01); *H01L 27/1157* (2013.01); *H01L 27/11565* (2013.01)

(58) Field of Classification Search
CPC ............. H01L 23/528; H01L 27/11526; H01L 27/11551; H01L 27/11556; H01L 27/11573; H01L 27/11578; H01L 27/11582

USPC .......................... 257/324, E29.262, 314–321
See application file for complete search history.

(56) References Cited

U.S. PATENT DOCUMENTS

| | | | |
|---|---|---|---|
| 8,742,466 B2* | 6/2014 | Shim | H01L 27/11551 257/211 |
| 2011/0092038 A1* | 4/2011 | Choi | H01L 27/11526 438/268 |
| 2013/0062680 A1 | 3/2013 | Kato et al. | |
| 2014/0021628 A1* | 1/2014 | Shih | H01L 21/76805 257/774 |
| 2014/0070302 A1 | 3/2014 | Yoo et al. | |
| 2016/0049422 A1* | 2/2016 | Kim | H01L 27/11582 257/324 |

FOREIGN PATENT DOCUMENTS

| | | |
|---|---|---|
| JP | 2010-21237 | 1/2010 |
| JP | 2013-62419 | 4/2013 |
| JP | 2014-57067 | 3/2014 |

* cited by examiner

*Primary Examiner* — Brook Kebede
(74) *Attorney, Agent, or Firm* — Oblon, McClelland, Maier & Neustadt, L.L.P.

(57) ABSTRACT

A semiconductor memory device according to an embodiment includes: an insulating layer; a conductive layer stacked above the insulating layer in a first direction, the conductive layer having a second direction as a longitudinal direction and a third direction as a short direction; and a channel semiconductor layer extending in the first direction, and the conductive layer including a recessed portion narrowed in the third direction.

10 Claims, 18 Drawing Sheets

SEMICONDUCTOR MEMORY DEVICE

CROSS-REFERENCE TO RELATED APPLICATIONS

This application is based upon and claims the benefit of priority from the prior U.S. Provisional Application 62/216,564, filed on Sep. 10, 2015, the entire contents of which are incorporated herein by reference.

BACKGROUND

Field

Embodiments of the present invention relate to a semiconductor memory device.

Description of the Related Art

Flash memories are ones of semiconductor memory devices. Especially, NAND-type flash memories are typically widely used because of a low cost and a large capacity. Many technologies for an increase in the capacity of the NAND-type flash memories have been proposed. One of the technologies is a structure in which memory cells are three-dimensionally arranged.

DETAILED DESCRIPTION

A semiconductor memory device according to an embodiment includes: an insulating layer; a conductive layer stacked above the insulating layer in a first direction, the conductive layer having a second direction as a longitudinal direction and a third direction as a short direction; and a channel semiconductor layer extending in the first direction, and the conductive layer including a recessed portion narrowed in the third direction.

Hereinafter, a semiconductor memory device according to an embodiment will be described with reference to the drawings.

First, an overall configuration of a semiconductor memory device according to an embodiment will be described.

Figure 1:
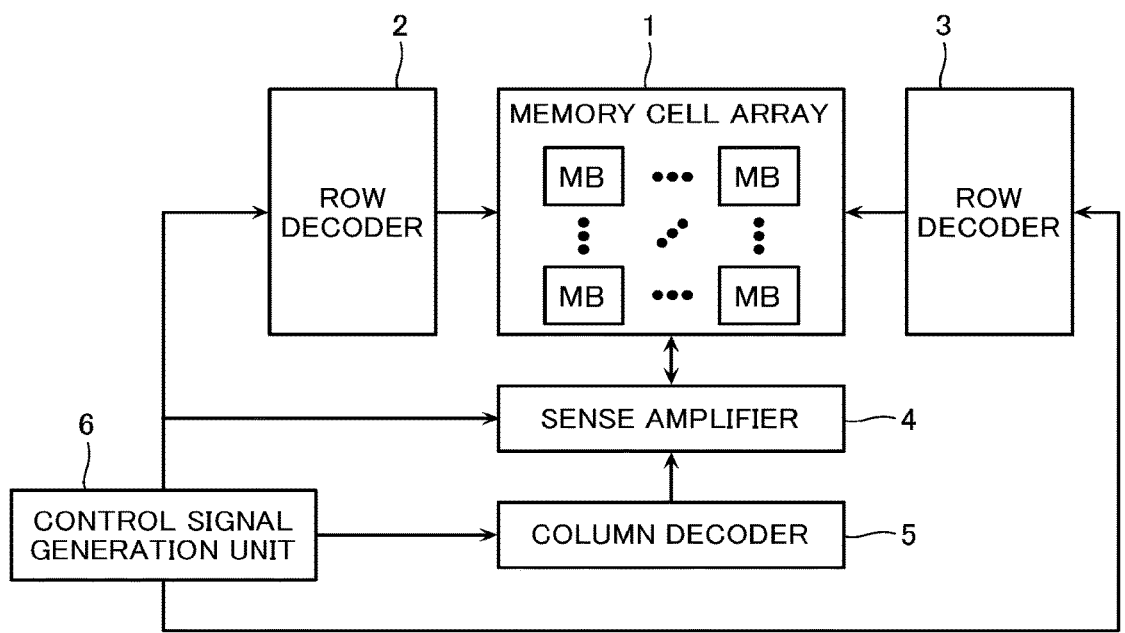
FIG. 1 is a diagram illustrating functional blocks of a semiconductor memory device according to an embodiment.

FIG. 1 is diagram illustrating functional blocks of a semiconductor memory device according to an embodiment.

The semiconductor memory device according to an embodiment includes a memory cell array 1, row decoders 2 and 3, a sense amplifier 4, a column decoder 5, and a control signal generation unit 6. The memory cell array 1 includes a plurality of memory blocks MB. Each memory block MB includes a plurality of three-dimensionally arrayed memory cells MC. The row decoders 2 and 3 decode taken block address signals and the like, and control a write operation and a read operation of data of the memory cell array 1. The sense amplifier 4 detects and amplifies an electrical signal flowing in the memory cell array 1 at the time of the read operation. The column decoder 5 decodes a column address signal, and controls the sense amplifier 4. The control signal generation unit 6 boosts a reference voltage, generates a high voltage used at the time of the write operation and an erasure operation and a control signal, and controls the row decoders 2 and 3, the sense amplifier 4, and the column decoder 5.

Next, a circuit configuration of the memory cell array 1 of an embodiment will be described.

Figure 2:
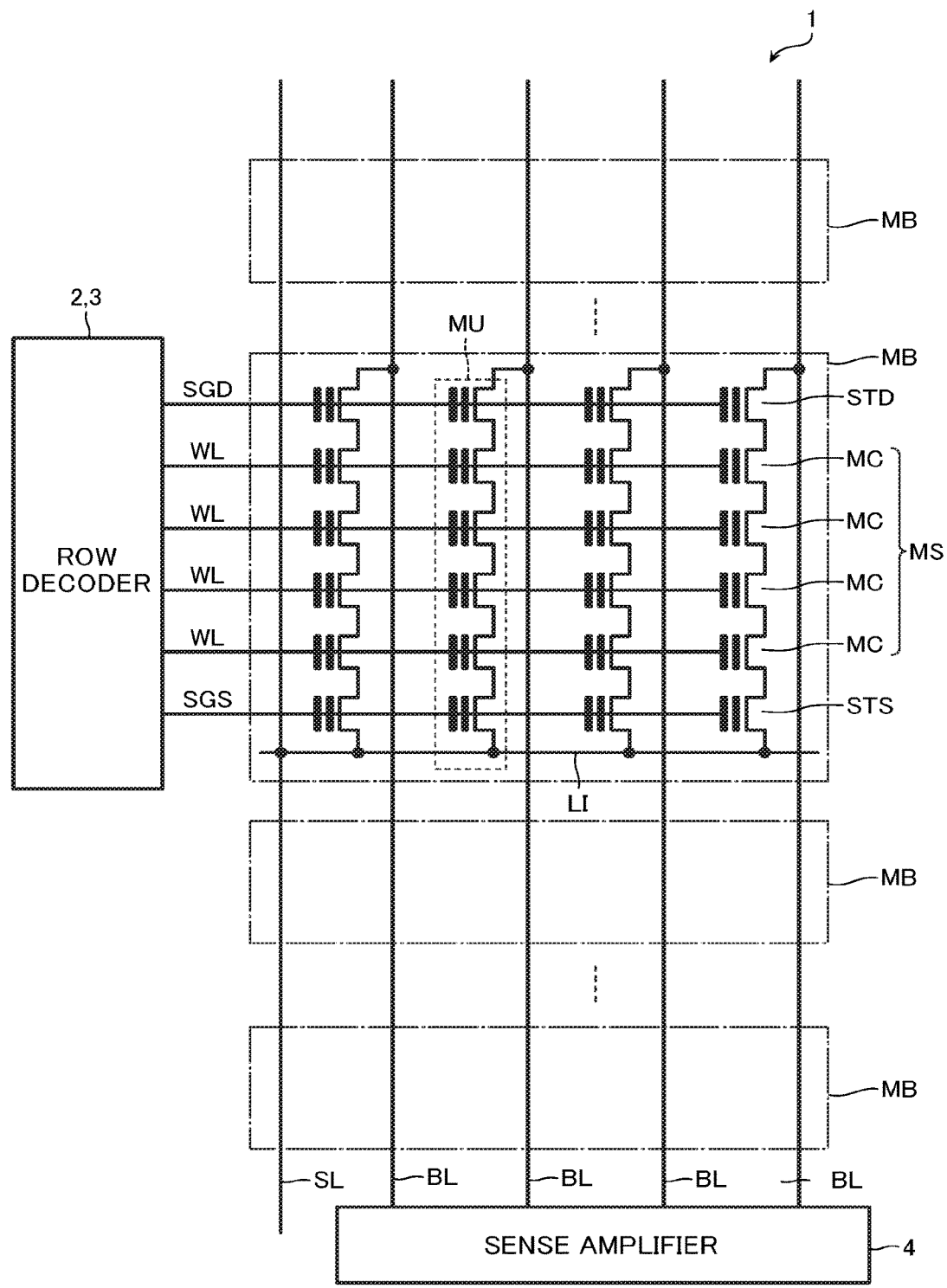
FIG. 2 is an equivalent circuit diagram of a memory cell array of a semiconductor memory device according to an embodiment.

FIG. 2 is an equivalent circuit diagram of the memory cell array of the semiconductor memory device of an embodiment.

As illustrated in FIG. 2, the memory cell array 1 includes the plurality of memory blocks MB. A plurality of bit lines BL and source lines SL are commonly connected to the plurality of memory blocks MB. Each memory block MB is connected to the sense amplifier 4 through the bit lines BL, and is connected to a source line driver (not illustrated) through the source lines SL.

The memory block MB includes a plurality of memory units MU, one end of the memory unit MU being connected to the bit line BL and the other end being connected to the source line SL through a source contact LI. Each memory unit MU includes a memory string MS, a source-side selection transistor STS connected between the memory string MS and the source contact LI, and a drain-side selection transistor STD connected between the memory string MS and the bit line BL.

The memory string MS includes a plurality of memory cells MC connected in series. Each memory cell MC is a transistor including a semiconductor layer, a charge storage layer, and a control gate, and accumulates charges in the charge storage layer and changes a threshold according to a voltage applied to the control gate. A word line WL is commonly connected to the control gates of a plurality of the memory cells MC that belongs to different memory strings MS. The plurality of memory cells MC is connected to the row decoders 2 and 3 through the word lines WL.

The source-side selection transistor STS includes a control gate to which a source-side selection gate line SGS is connected. The source-side selection gate line SGS is connected to the row decoders 2 and 3, and selectively connects the memory string MS and a semiconductor substrate according to an input signal.

The drain-side selection transistor STD includes a control gate to which a drain-side selection gate line SGD is connected. The drain-side selection gate line SGD is connected to the row decoders 2 and 3, and selectively connects the memory string MS and the bit line BL according to an input signal.

Next, a schematic structure of the memory cell array 1 of an embodiment will be described.

Figure 3:
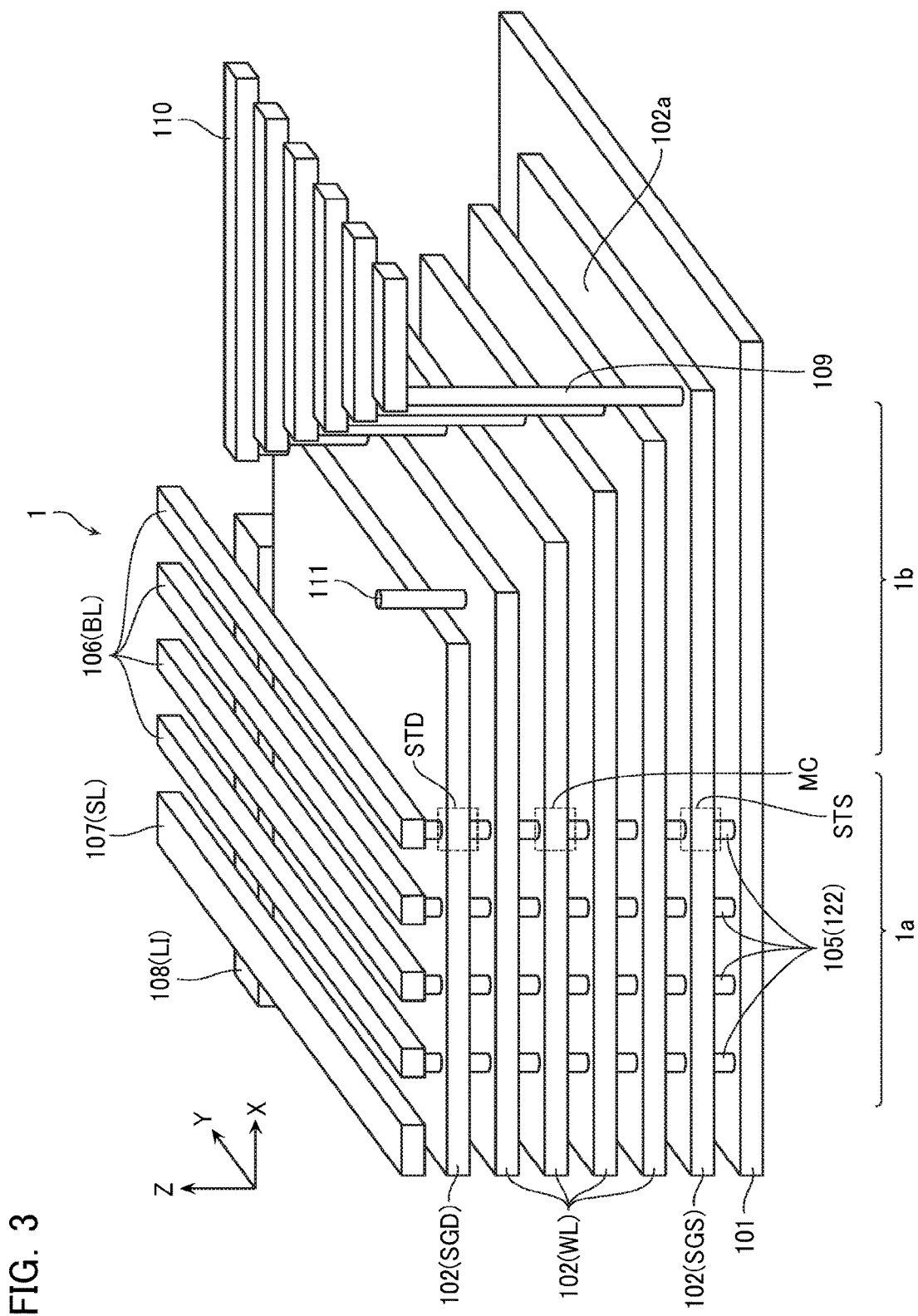
FIG. 3 is a perspective view illustrating a schematic structure of a memory cell array of a semiconductor memory device according to an embodiment.

FIG. 3 is a perspective view illustrating a schematic structure of the memory cell array of the semiconductor memory device according to an embodiment.

The memory cell array 1 includes, as illustrated in FIG. 3, a semiconductor substrate 101, and a plurality of conductive layers 102 stacked above the semiconductor substrate 101 in a Z direction.

The memory cell array 1 includes a plurality of memory columnar bodies 105 extending in the Z direction. An intersection portion of the conductive layer 102 and the memory columnar body 105 functions as the source selection transistor STS, the memory cell MC, or the drain-side selection transistor STD. The conductive layer 102 is formed of a tungsten (W), polysilicon (poly-Si), or the like, for example, and functions as the source-side selection gate line SGS, the word line WL, and the drain-side selection gate line SGD.

Further, the plurality of conductive layers 102 is formed in a stepwise manner. That is, a predetermined conductive layer 102 includes a contact portion 102a that does not face a lower surface of another conductive layer 102 positioned in an upper layer. Further, the conductive layer 102 is connected with a via 109 in the contact portion 102a. A wire 110 is arranged above an upper end of the via 109. Note that the via 109 and the wire 110 are formed of tungsten (W), or the like.

Further, the memory cell array 1 includes a conductive layer 108 that faces side surfaces of a Y direction of the plurality of conductive layers 102, and extends in an X direction. A lower surface of the conductive layer 108 is in contact with the semiconductor substrate 101. The conductive layer 108 is formed of tungsten (W), or the like, and functions as the source contact LI.

Further, the memory cell array 1 includes a plurality of conductive wires 106 and a conductive wire 107 above the plurality of conductive layers 102 and the memory columnar bodies 105. The conductive wires 106 and the conductive wire 107 are arranged in the X direction, and extend in the Y direction. The memory columnar bodies 105 are electrically connected to lower surfaces of the conductive wires 106, respectively. Note that the conductive wire 106 is formed of tungsten (W), or the like, and functions as the bit line BL. The conductive layer 108 is electrically connected to a lower surface of the conductive wire 107. The conductive wire 107 is formed of tungsten (W), or the like, and functions as the source line SL.

Further, the memory cell array 1 includes a beam columnar body 111. The beam columnar body 111 communicates into holes formed in the plurality of conductive layers 102, and maintains postures of the contact portions 102a of the plurality of conductive layers 102.

Hereinafter, an area of the memory cell array 1, where the plurality of memory columnar bodies 105 is arranged, may be called "memory area 1a", and an area of the memory cell array 1, where the contact portions 102a of the plurality of conductive layers 102 is formed, may be called "contact area 1b".

Next, a schematic structure of the memory cell MC of an embodiment will be described.

Figure 4:
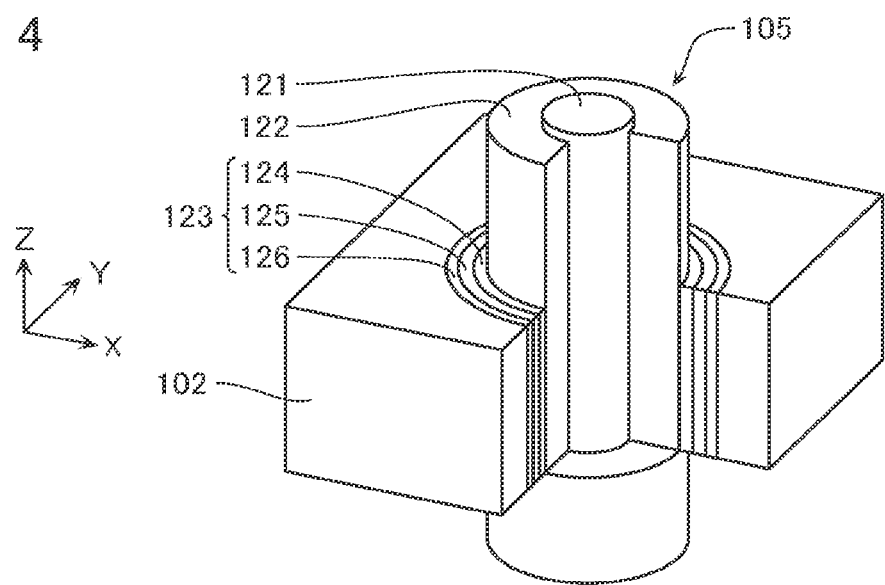
FIG. 4 is a perspective view illustrating a schematic structure of a memory cell of a semiconductor memory device according to an embodiment.

FIG. 4 is a perspective view illustrating a schematic structure of the memory cell of the semiconductor memory device according to an embodiment. The source-side selection transistor STS and the drain-side selection transistor STD may have a similar structure to FIG. 4.

The memory cell MC is formed in the intersection portion of the conductive layer 102 and the memory columnar body 105. The memory columnar body 105 includes a core insulating layer 121, and a semiconductor layer 122 that covers a side surface of the core insulating layer 121. The memory cell array 1 further includes a multifilm layer 123 arranged between the semiconductor layer 122 and the conductive layer 102. The multifilm layer 123 includes a tunnel insulating layer 124, a charge storage layer 125, and a block insulating layer 126 formed from the semiconductor layer 122 to the conductive layer 102, for example. In the present embodiment, a configuration from the core insulating layer 121 to the first block insulating film 126A is included in the memory columnar body 105, as described above.

The core insulating layer 121 is formed of silicon oxide ($SiO_2$), or the like. The semiconductor layer 122 is formed of polysilicon (poly-Si), or the like, and functions as channels of the memory cell MC, the source-side selection transistor STS, and the drain-side selection transistor STD. The tunnel insulating layer 124 is formed of silicon oxide ($SiO_2$), or the like. The charge storage layer 125 is formed of a material such as silicon nitride (SiN), which can accumulate charges. The block insulating layer 126 includes a silicon oxide film formed of silicon oxide ($SiO_2$), or the like.

Note that the memory cell MC may have a structure using a floating gate formed of polysilicon (poly-Si), or the like, as the charge storage layer 125, instead of the above-described structure. The floating gate is provided at a position of each of the conductive layer 102 corresponding to the word line WL.

Next, a structure of the memory cell array 1 will be described in detail.

Figure 5:
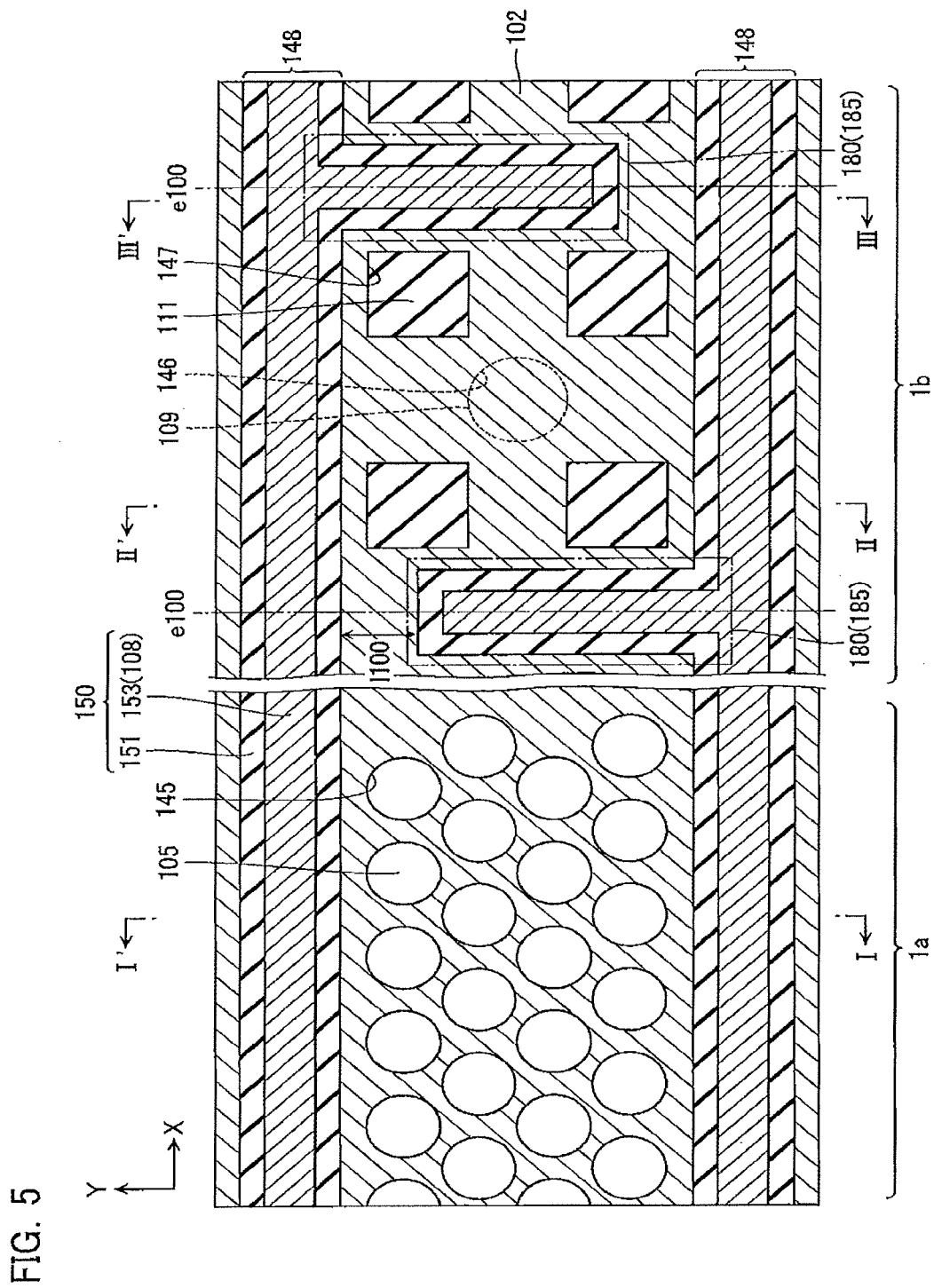
FIGS. 5 to 8 are sectional views of a memory cell array of a semiconductor memory device according to an embodiment.
Figure 6:
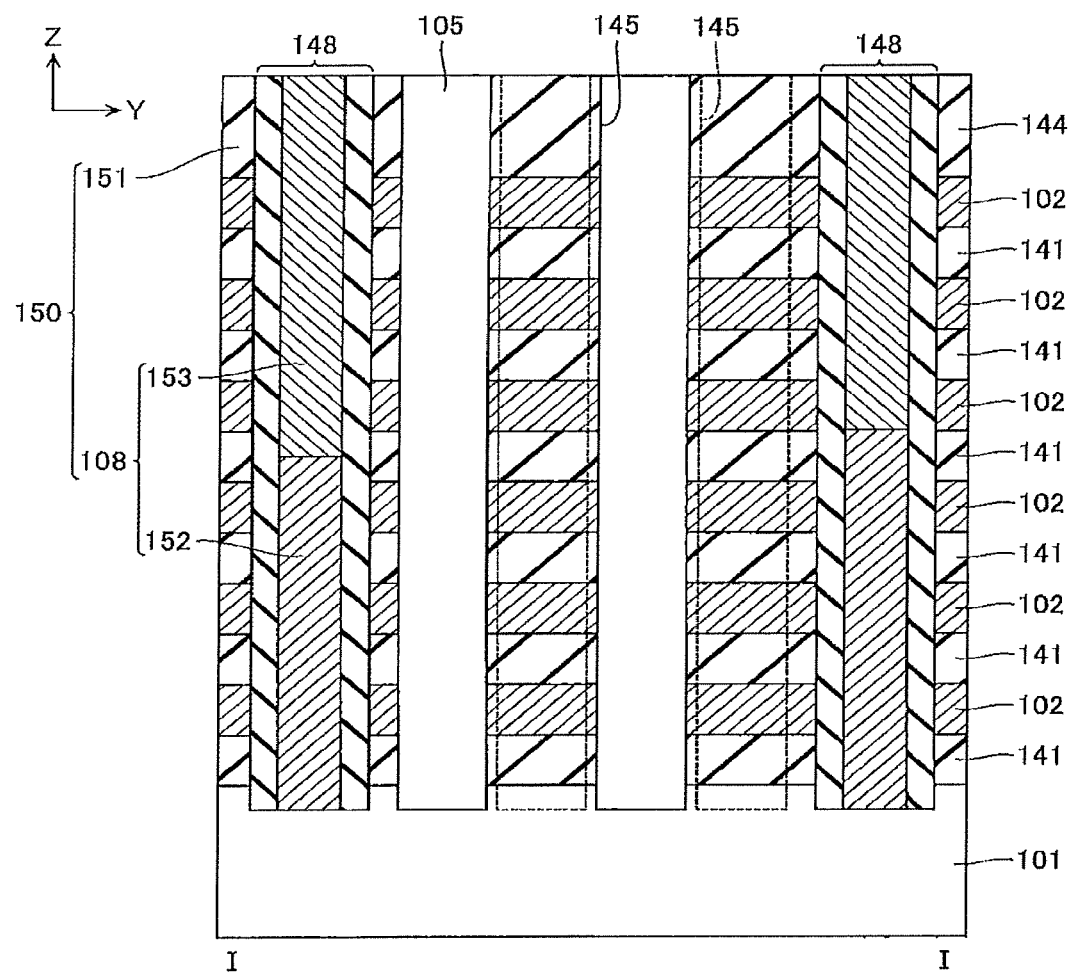
Figure 7:
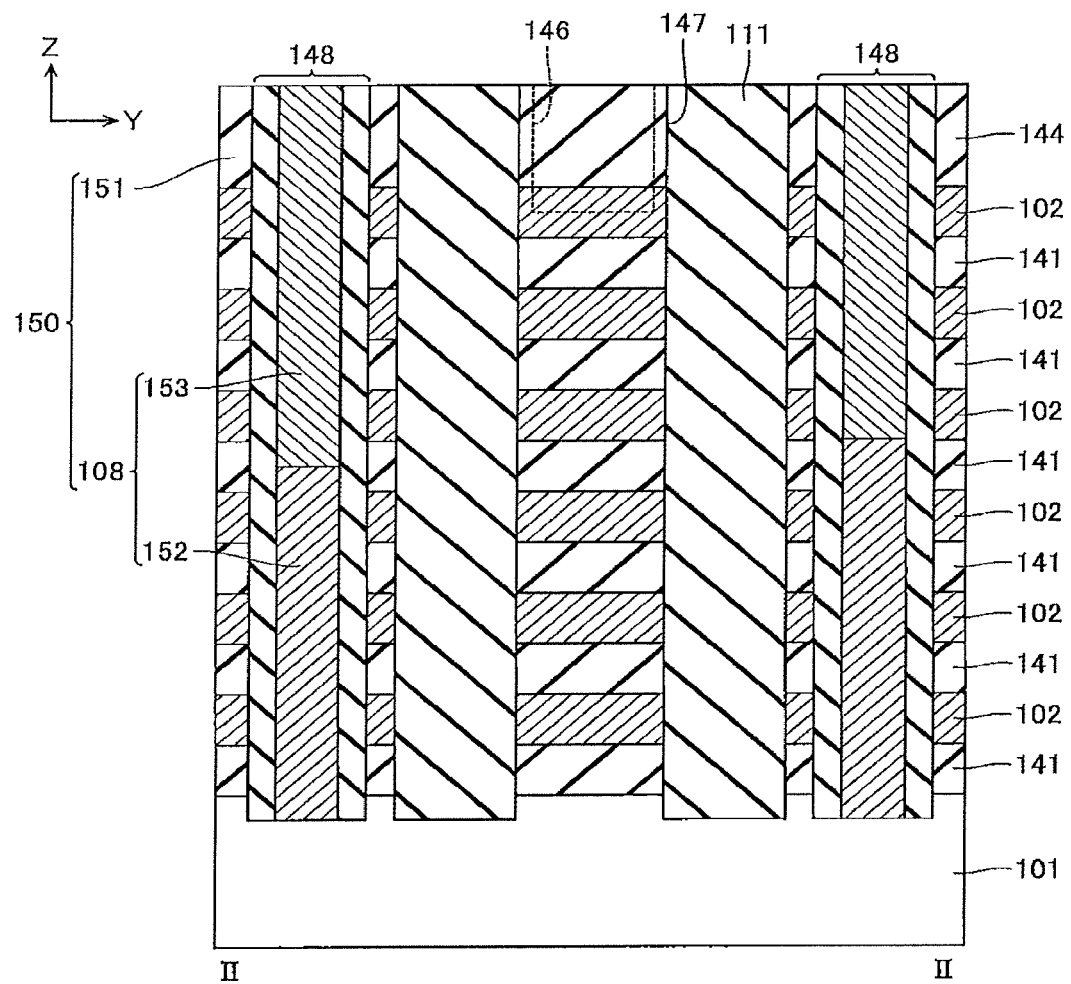
Figure 8:
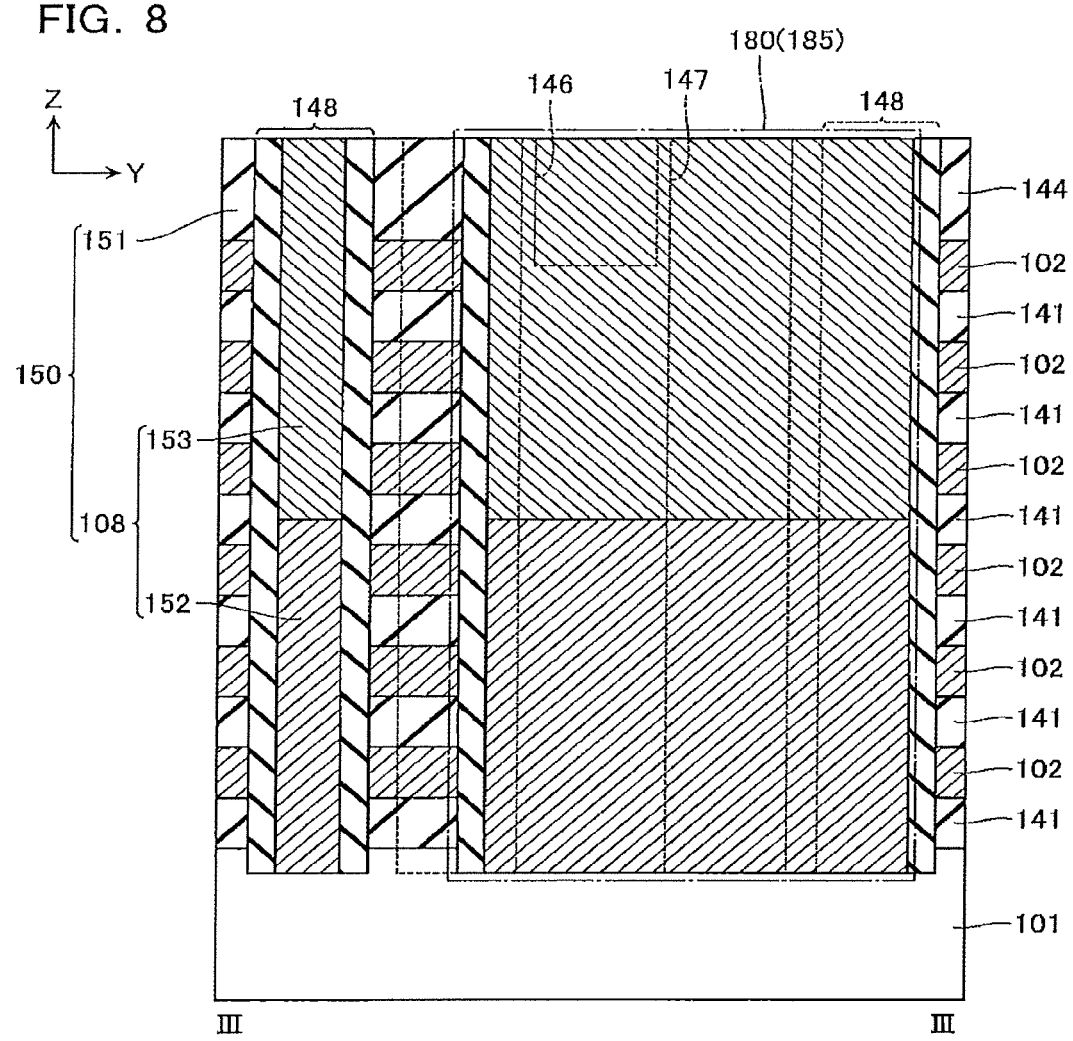

FIGS. 5 to 8 are sectional views of the memory cell array of the semiconductor memory device of an embodiment. FIG. 5 is a sectional view of the X-Y directions in a position of the conductive layer 102. FIG. 6 is a sectional view of the Y-Z directions illustrated by I-I' of FIG. 5. FIG. 7 is a sectional view of the Y-Z directions illustrated by II-II' of FIG. 5. FIG. 8 is a sectional view of the Y-Z directions illustrated by III-III' of FIG. 5.

The memory cell array 1 includes a plurality of interlayer insulating layers 141 and the conductive layers 102 alternately stacked above the semiconductor substrate 101, and an interlayer insulating layer 144 stacked above the conductive layer 102.

A plurality of memory holes 145 that penetrates from the interlayer insulating layer 144 to the lowermost interlayer insulating layers 141 in the Z direction, and reaches an upper portion of the semiconductor substrate 101 is formed in the memory area 1a of the memory cell array 1, and the plurality of memory columnar bodies 105 is embedded in these memory holes 145.

Meanwhile, a plurality of via holes 146 that extends from an upper surface of the interlayer insulating layer 144 and reaches the respective conductive layers 102 in the z direction is formed in the contact area 1b of the memory cell array 1, and the plurality of vias 109 is embedded in the via holes 146. The vias 109 and the via holes 146 do not appear in the cross section of the X-Y directions in the position of the conductive layer 102, and are thus illustrated by the broken line in FIG. 5. The same applies to FIGS. 9 to 13, 15, and 16, described below. Further, a plurality of beam holes 147 that penetrates the contact area 1b from the interlayer insulating layer 144 to the interlayer insulating layers 141 in the Z direction, and reaches the upper portion of the semiconductor substrate 101 is formed in the contact area 1b of the memory cell array 1, and the plurality of beam columnar bodies 111 is embedded in the beam holes 147. Further, a plurality of grooves 148 is formed in the memory cell array 1 to sandwich the arranged areas of the memory columnar bodies 105, the vias 109, and the beam columnar bodies 111, where the Z direction is a depth direction and the X direction is an extending direction. Element separation sections 150 are arranged in the grooves 148.

The element separation section 150 includes the conductive layer 108 arranged in an inner side surface of the groove 148 through an insulating layer 151. The conductive layer 108 is electrically connected to the source line 107 (not illustrated) arranged above the interlayer insulating layer 144. The conductive layer 108 has a stack structure of two conductive films 152 and 153 from the semiconductor substrate 101 to the source line 107. The conductive film 152 is formed of polysilicon (poly-Si), or the like. The conductive film 153 is formed of tungsten (W), or the like. Here, a portion of the conductive layer 102 separated by the element separation section 150 may be called "partial conductive layer 102'".

In an embodiment, the partial conductive layer 102' includes a recessed portion 180 recessed in the Y direction in the contact area 1b. The recessed portion 180 has a smaller length in the Y direction than a width of the partial conductive layer 102' in the Y direction by a predetermined length 1100 so that the partial conductive layer 102' is not completely separated in the X direction. In other words, the element separation section 150 can be said to include a protruding portion 185 protruding in the Y direction in the contact area 1b. The protruding portion 185 has a smaller length in the Y direction than the width of the partial conductive layer 102' by the predetermined length 1100 so that the partial conductive layer 102' is not completely separated in the X direction.

In the example of FIG. 5, the recessed portion 180 or the protruding portion 185 is arranged in a position e100 of a stepwise-shaped step formed in the contact portion 102a of the plurality of conductive layers 102. However, the recessed portion 180 or the protruding portion 185 may be arranged in an arbitrary position.

Here, as a comparative example, a semiconductor memory device that does not include a protruding portion in an element separation section, and does not include a recessed portion in a partial conductive layer will be considered. The semiconductor memory device uses a conductive layer as a word line WL, and a bend occurs in a wafer due to film stress that the conductive layer has. The bend includes a bend in the X direction and a bend in the Y direction opposite to the bend in the X direction. Among them, an influence of the bend in the Y direction is small because the conductive layer is divided by the element separation section. In contrast, an influence of the bend in the X direction is large because the conductive layer is integrally formed from the memory area to the contact areas formed at both sides of the memory area.

In this regard, according to the semiconductor memory device of an embodiment, the element separation section 150 includes the protruding portion 160 protruding in the Y direction, and the partial conductive layer 102' includes the recessed portion 170 narrowed in the Y direction. Therefore, the conductive layer 102 is partially divided in the X direction. As a result, compared with the comparative example, the bend in the X direction can be reduced.

Next, examples of layouts of the protruding portions of the element separation sections 150 and the recessed portions of the partial conductive layers 102' will be described.

FIGS. 9 to 16 are diagrams illustrating layouts of the element separation section of the memory cell array of the semiconductor memory device according to an embodiment. FIGS. 9 to 16 are sectional views of the X-Y directions in a position of the conductive layer 102. Hereinafter, two side surfaces of the element separation section 150 or the partial conductive layers 102' along the X direction may be called "first side surface" and "second side surface".

Figure 9:
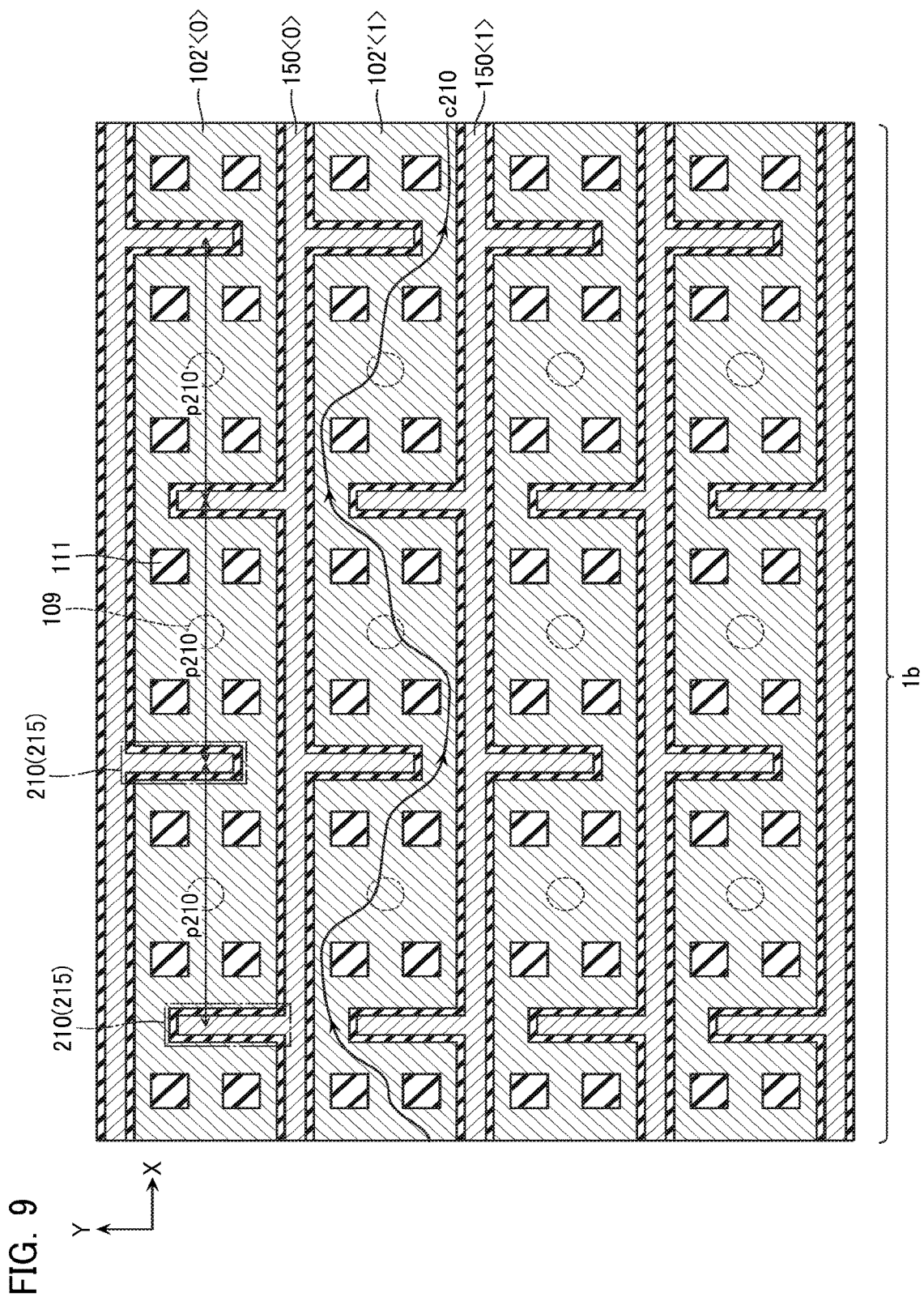
FIGS. 9 to 16 are diagrams illustrating a layout of an element separation section of a memory cell array of a semiconductor memory device according to an embodiment.

The layout of FIG. 9 is an example in which a plurality of recessed portions 210 of the partial conductive layer 102' are alternately arranged in the first side surface and the second side surface of the partial conductive layer 102' in the contact area 1b. The plurality of recessed portions 210 is arranged in an equal pitch p210 in the X direction, to be specific, in every two beam columnar bodies 111. The plurality of recessed portions 210 of a predetermined partial conductive layer 102'<0> is arranged in the same layout as the plurality of recessed portions 210 of an adjacent partial conductive layer 102'<1> in the Y direction.

In other words, the layout of FIG. 9 can be said to be an example in which a plurality of protruding portions 215 of the element separation sections 150 is alternately arranged in the first side surface and the second side surface in the contact area 1b. The plurality of protruding portions 215 is arranged in the equal pitch p210 in the X direction. The plurality of protruding portions 215 of a predetermined element separation section 150<0> is arranged in the same layout as the plurality of protruding portions 215 of an adjacent element separation section 150<1> in the Y direction.

In the case of this layout, a current path c210 can be secured by snaking and proceeding between the first side surface and the second side surface.

Figure 10:
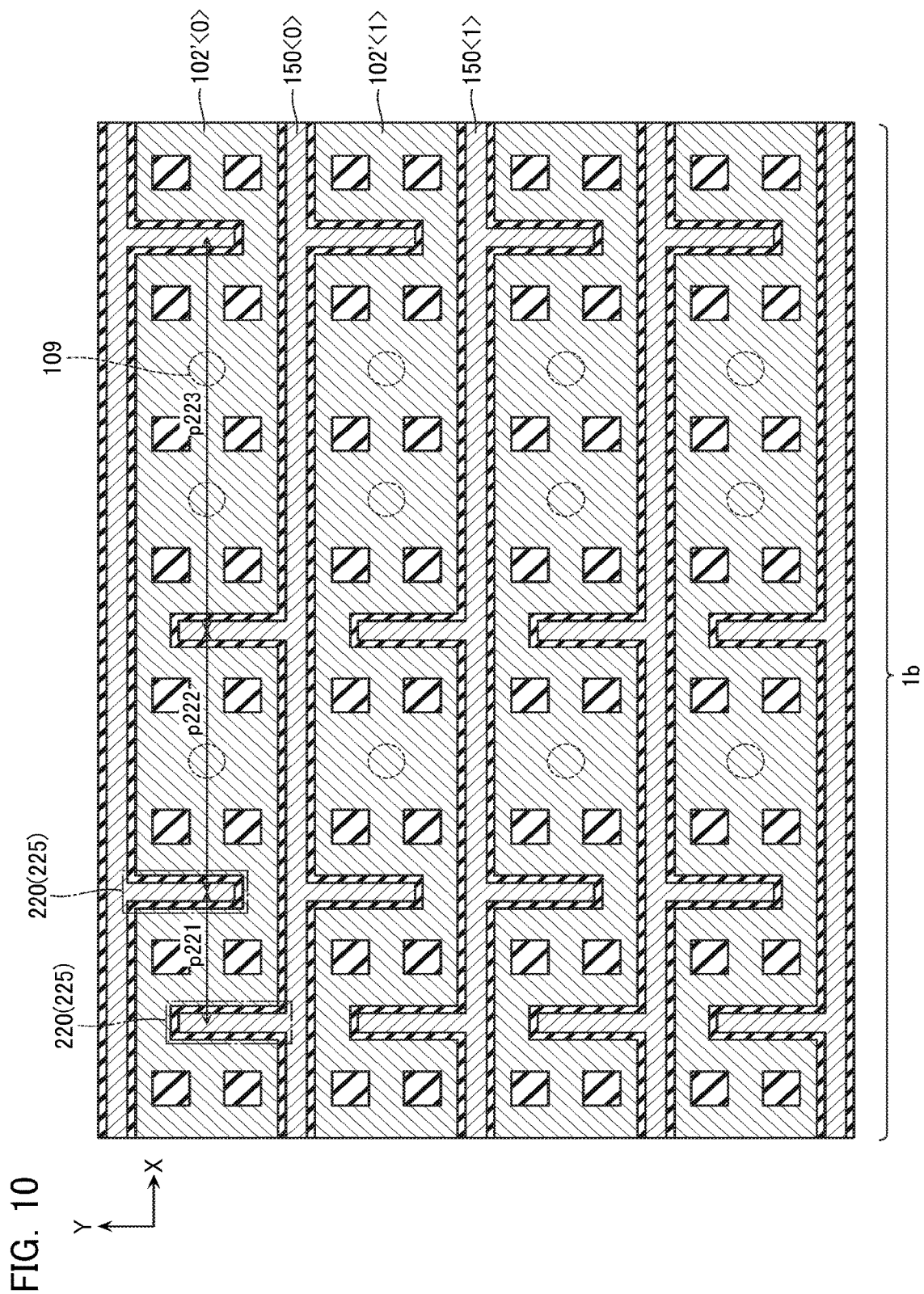

The layout of FIG. 10 is an example in which a plurality of recessed portions 220 of the partial conductive layer 102' is alternately arranged in the first side surface and the second side surface of the partial conductive layer 102' in the contact area 1b. The plurality of recessed portions 220 is arranged in a plurality of different pitches p221 to p223 in the X direction. The plurality of recessed portions 220 of a predetermined partial conductive layer 102'<0> is arranged in the same layout as the plurality of recessed portions 220 of an adjacent partial conductive layer 102'<1> in the Y direction.

In other words, the layout of FIG. 10 can be said to be an example in which a plurality of protruding portions 225 of the element separation sections 150 is alternately arranged in the first side surface and the second side surface in the contact area 1b. The plurality of protruding portions 225 are arranged in the plurality of different pitches p221 to p223 in the X direction. The plurality of protruding portions 225 of a predetermined element separation section 150<0> is arranged in the same layout as the plurality of protruding portions 225 of the adjacent element separation section 150<1> in the Y direction.

Like this layout, the recessed portions 220 or the protruding portions 225 are not necessarily arranged in an equal pitch in the X direction, and may be arranged in a variable pitch according to the stepwise shape of the contact area 1b and the arrangement of the via columnar bodies 109.

Figure 11:
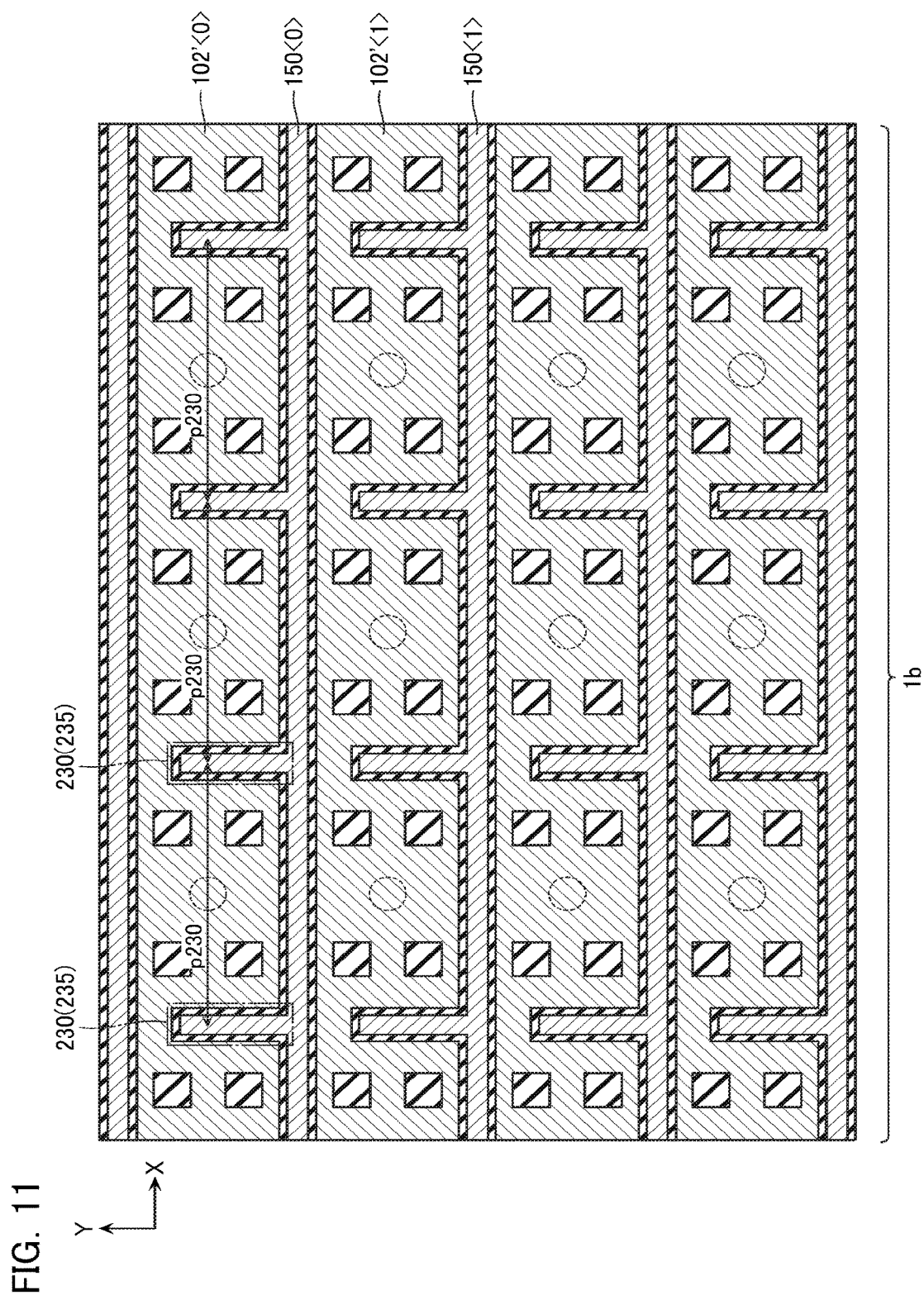

The layout of FIG. 11 is an example in which a plurality of recessed portions 230 of the partial conductive layer 102 is arranged in only one of the first side surface and the second side surface of the partial conductive layer 102' in the contact area 1b. The plurality of recessed portions 230 is arranged in an equal pitch p230 in the X direction. The plurality of recessed portions 230 of a predetermined partial conductive layer 102'<0> is arranged in the same layout as the plurality of recessed portions 230 of an adjacent partial conductive layer 102'<1> in the Y direction.

In other words, the layout of FIG. 11 can be said to be an example in which a plurality of protruding portions 235 of the element separation section 150 is arranged in only one of the first side surface and the second side surface in the contact area 1b. The plurality of protruding portions 235 is arranged in the equal pitch p230 in the X direction. The plurality of protruding portions 235 of a predetermined element separation section 150<0> is arranged in the same layout as the plurality of protruding portions 235 of an adjacent element separation section 150<1> in the Y direction.

Like this layout, the recessed portions 230 or the protruding portions 235 are not necessarily alternately arranged in the first side surface and the second side surface of the partial conductive layer 102' or the element separation sections 150, and may be arranged in only one of the first side surface and the second side surface.

Figure 12:
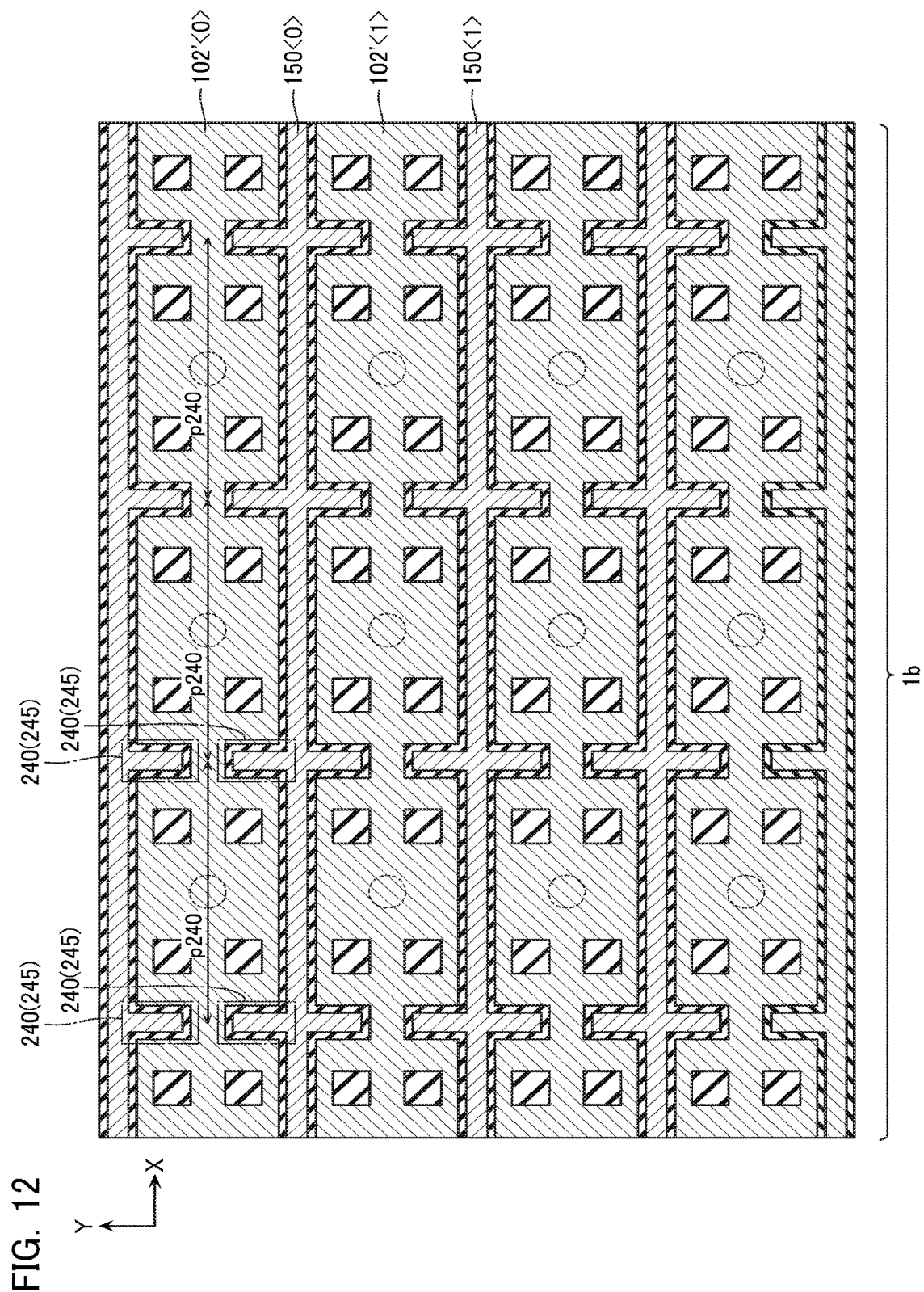

The layout of FIG. 12 is an example in which a plurality of recessed portions 240 of the partial conductive layer 102' is arranged in the same positions of the first side surface and the second side surface of the partial conductive layer 102' in the x direction in the contact area 1b. The plurality of recessed portions 240 is arranged in an equal pitch p240 in the X direction. The plurality of recessed portions 240 of a predetermined partial conductive layer 102'<0> is arranged in the same layout as the plurality of recessed portions 240 of an adjacent partial conductive layer 102'<1> in the Y direction.

In other words, the layout of FIG. 12 can be said to be an example in which a plurality of protruding portions 245 of the element separation sections 150 is arranged in the same positions of the first side surface and the second side surface in the x direction in the contact area 1b. The plurality of protruding portions 245 is arranged in the equal pitch p240 in the X direction. The plurality of protruding portions 245 of a predetermined element separation section 150<0> is arranged in the same layout as the plurality of protruding portions 245 of an adjacent element separation section 150<1> in the Y direction.

Like the layout, the recessed portions 240 or the protruding portions 245 are not necessarily arranged in different positions in the first side surface and the second side surface of the partial conductive layer 102' or the element separation sections 150 in the X direction, and may be arranged in the same positions of the first side surface and the second side surface in the X direction, in a range where the partial conductive layer 102' is not divided in the X direction.

Figure 13:
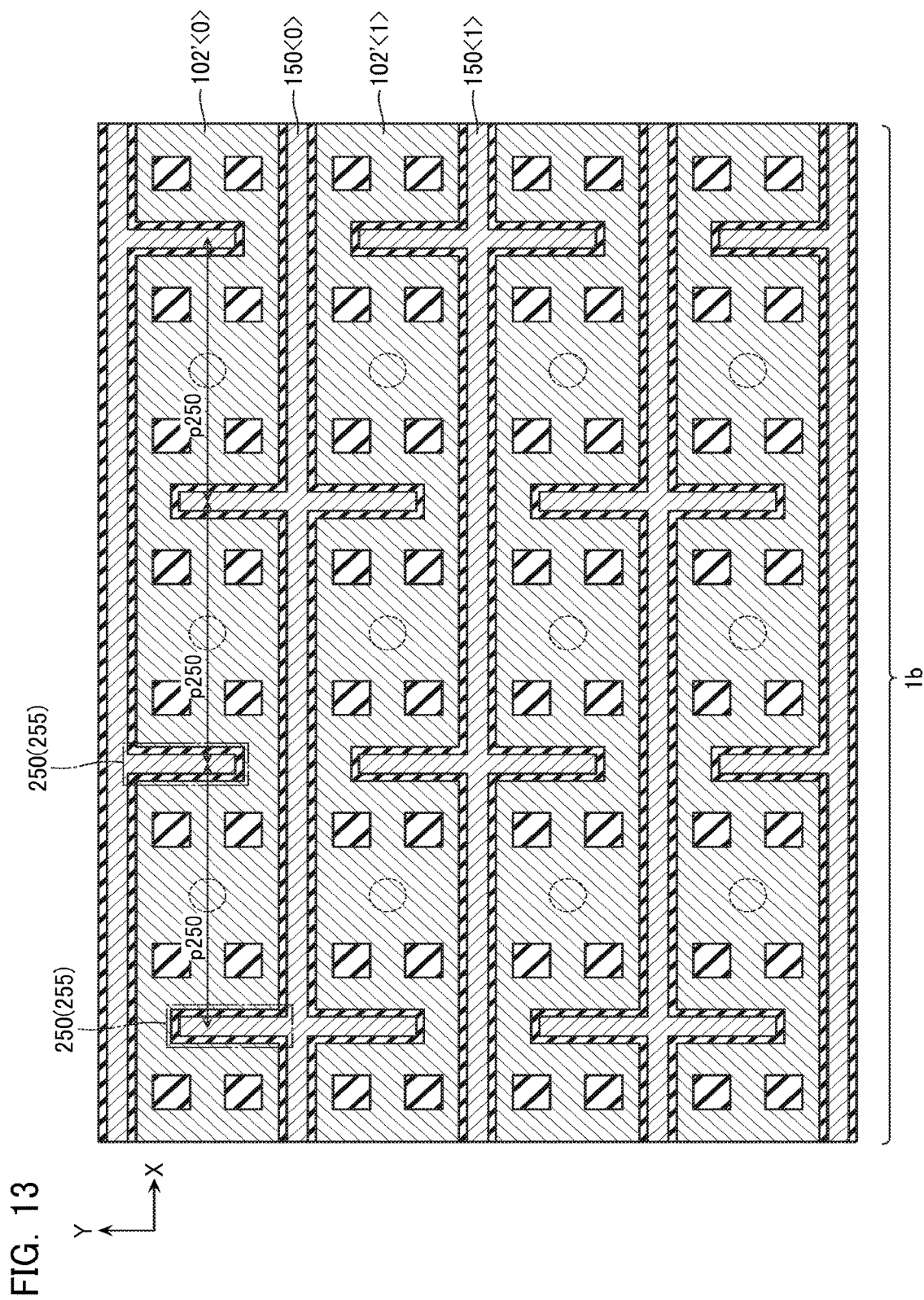

The layout of FIG. 13 is an example in which a plurality of recessed portions 250 of the partial conductive layer 102' is alternately arranged in the first side surface and the second side surface of the partial conductive layer 102' in the contact area 1b. The plurality of recessed portions 250 is arranged in an equal pitch p250 in the X direction. The plurality of recessed portions 250 of a predetermined partial conductive layer 102'<0> is arranged in the same layout in the Y direction as the plurality of recessed portions 250 of an adjacent partial conductive layer 102'<1> in the Y direction.

In other words, the layout of FIG. 13 can be said to be an example in which a plurality of protruding portions 255 of the element separation sections 150 is arranged in the same positions of the first side surface and the second side surface in the x direction in the contact area 1b. The plurality of protruding portions 255 is arranged in the equal pitch p250 in the X direction.

Like this layout, the recessed portions 250 of all partial conductive layers 102' are not necessarily arranged in the same layout, and for example, the plurality of recessed portions 250 of two adjacent partial conductive layers 102' in the Y direction may be arranged in a linearly symmetrical layout in the Y direction in the respective partial conductive layers 102'.

Figure 14:
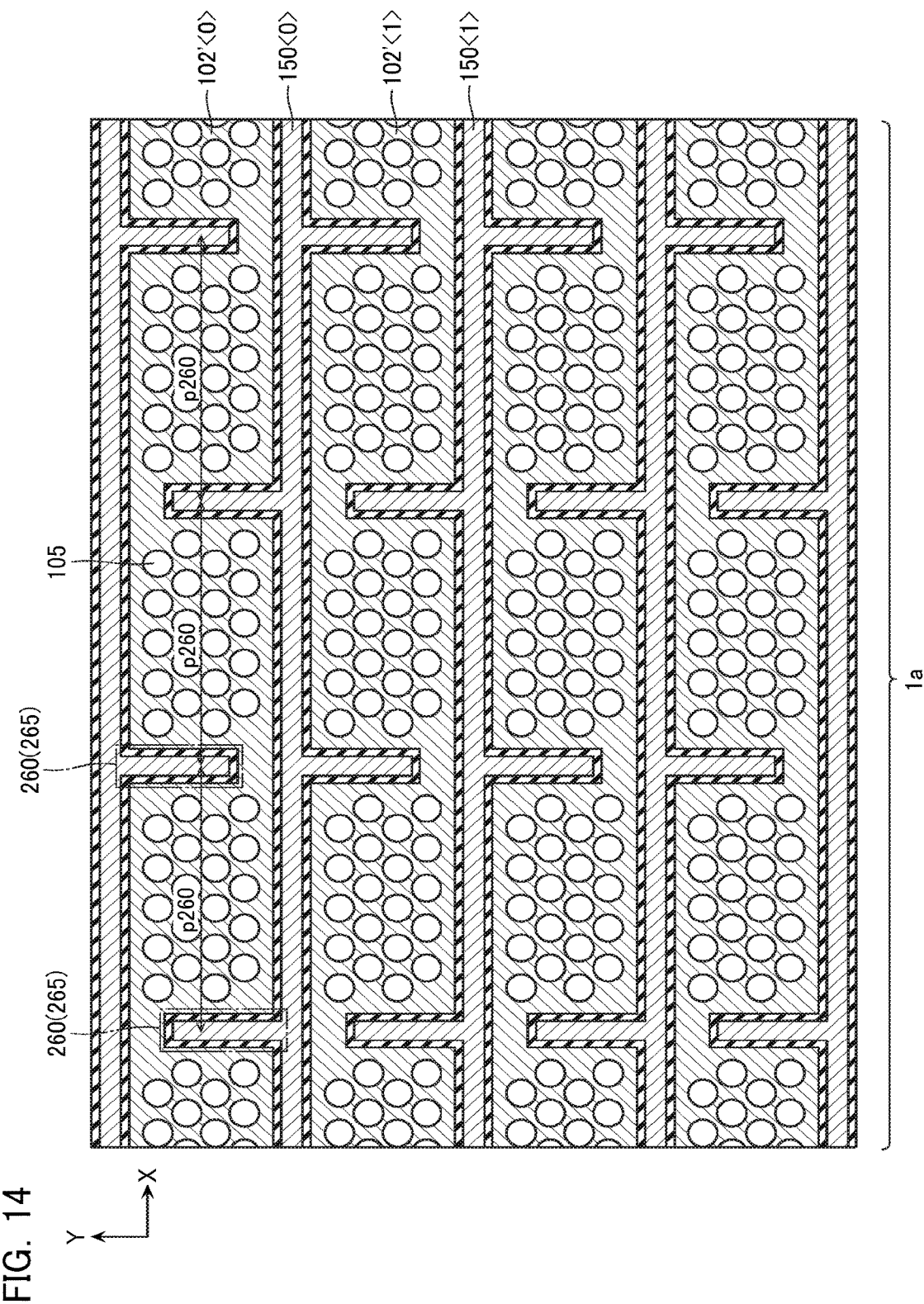

The layout of FIG. 14 is an example in which a plurality of recessed portions 260 of the partial conductive layer 102' is alternately arranged in the first side surface and the second side surface of the partial conductive layer 102' in the memory area 1a. The plurality of recessed portions 260 is arranged in an equal pitch p260 in the X direction. The plurality of recessed portions 210 of a predetermined partial conductive layer 102'<0> is arranged in the same layout as the plurality of recessed portions 260 of an adjacent partial conductive layer 102'<1> in the Y direction.

In other words, the layout of FIG. 14 can be said to be an example in which a plurality of protruding portions 265 of the element separation sections 150 is alternately arranged in the first side surface and the second side surface in the memory area 1a. The plurality of protruding portions 265 is arranged in the equal pitch p260 in the X direction. The plurality of protruding portions 265 of a predetermined element separation section 150<0> is arranged in the same layout as the plurality of protruding portions 265 of an adjacent element separation section 150<1> in the Y direction.

Like this layout, when a desired number of memory columnar bodies 105 can be arranged in the memory area 1a, the recessed portions 260 or the protruding portions 265 are not necessarily arranged in the contact area 1b, and may be arranged in the memory area 1a.

Figure 15:
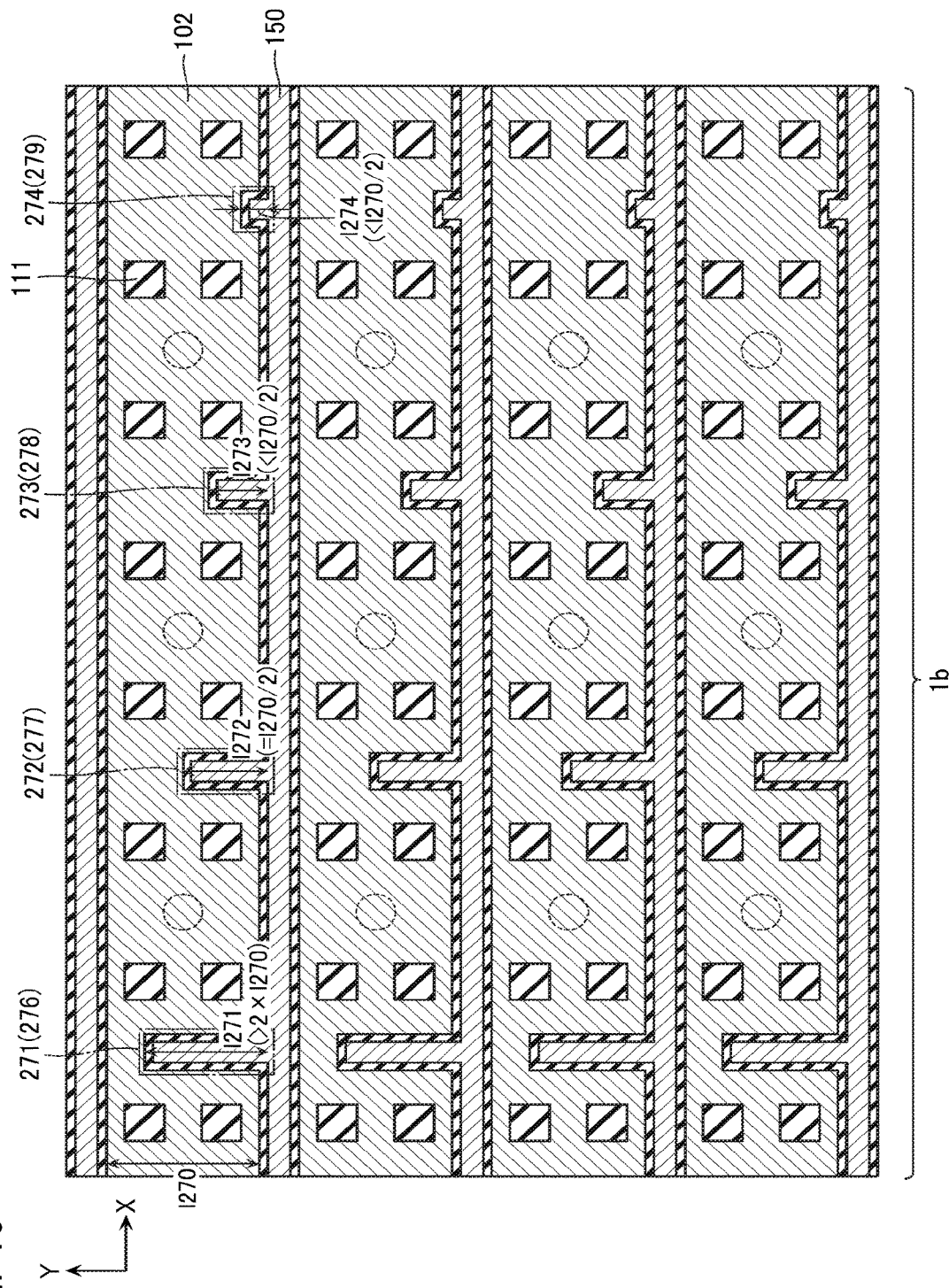

The layout of FIG. 15 is an example in which a plurality of recessed portions 271 to 274 having different lengths in the Y direction is arranged in one partial conductive layer 102'. To be specific, the recessed portion 271 has a length 1271 that is larger than ½ the width 1270 of the partial conductive layer 102' in the Y direction. The recessed portion 272 has a length 1272 of ½ the width 1270. The recessed portions 273 and 274 have lengths 1273 and 1274 that are smaller than ½ the width 1270. Note that the length 1274 is a length in a range not overlapping with an arranged place of the beam columnar body 111 in the Y direction.

In other words, the layout of FIG. 15 can be said to be an example in which a plurality of protruding portions 276 to 279 having different lengths in the Y direction is arranged in one element separation section 150. To be specific, the protruding portion 276 has a length 1271 that is larger than ½ the width 1270 of the partial conductive layer 102' in the Y direction. The protruding portion 277 has a length 1272 of ½ the width 1270. The protruding portions 278 and 279 have lengths 1273 and 1274 that are smaller than ½ the width 1270. Note that the length 1274 has a length in a range not overlapping with an arrangement place of the beam columnar body 111 in the Y direction.

Like this layout, the lengths 1271 to 1274 of the recessed portions 271 to 274 or the protruding portions 276 to 279 in the Y direction may be arbitrarily selected in consideration of structural strength and electrical resistance of the partial conductive layer 102'. Note that, in the example of FIG. 15, the lengths 1271 to 1274 of the recessed portions 271 to 274 or the protruding portions 276 to 279 in the Y direction are different. However, the lengths of all of the recessed portions or the protruding portion in the Y direction may be the same.

Figure 16:
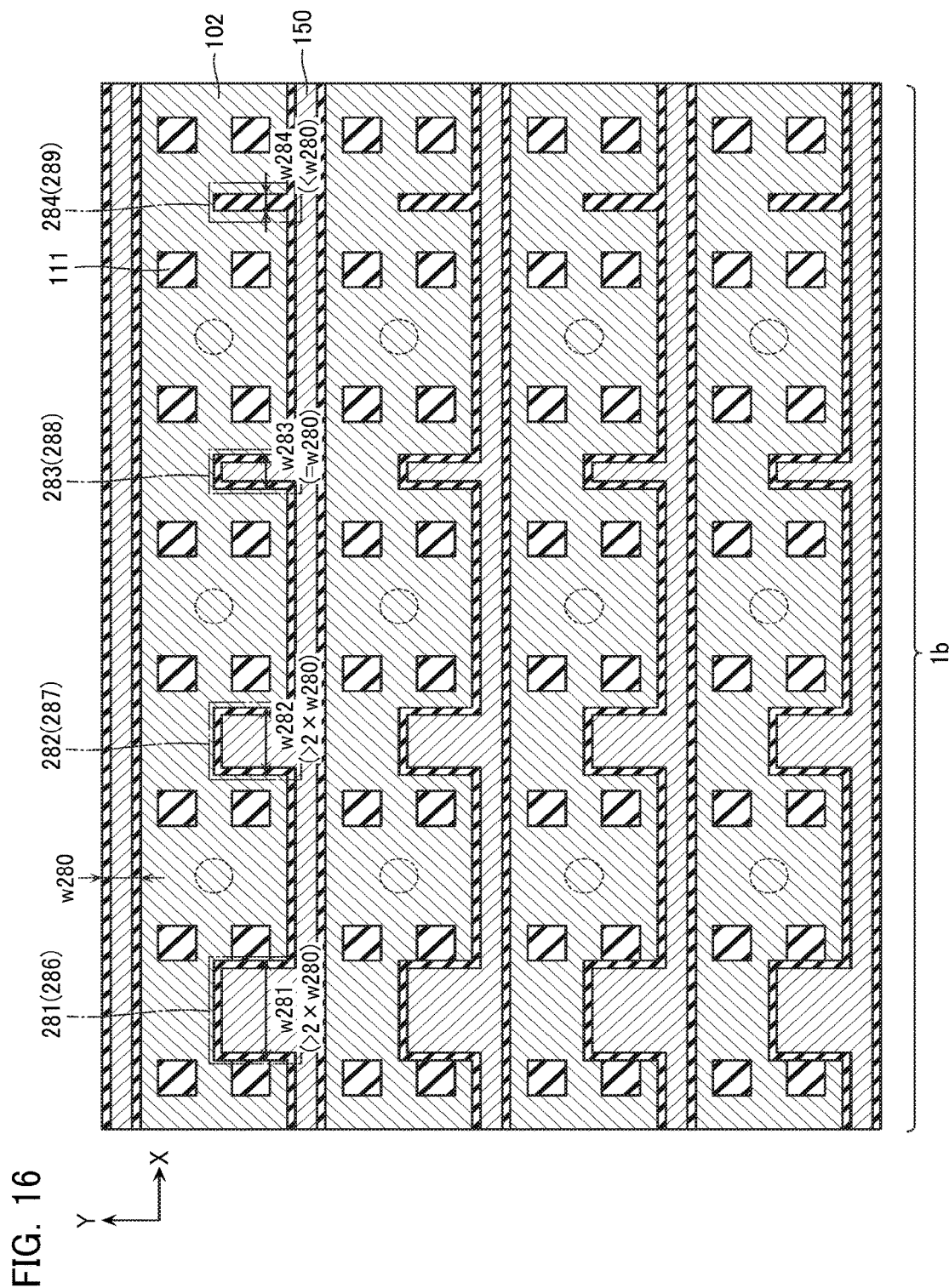

The layout of FIG. 16 is an example in which a plurality of recessed portions 281 to 284 having different widths in the X direction is arranged in one partial conductive layer 102'. To be specific, the recessed portions 281 and 282 have widths w281 and w282 in the X direction that are twice or more the width w280 of the element separation section 150 in the Y direction. The width w281 is the same width in the X direction as a space between the adjacent beam columnar bodies 111 in the X direction. The recessed portion 283 has the same width as the width of the element separation section 150 in the Y direction. The recessed portion 283 has a width w283 in the X direction that is the same as the width w280. The recessed portion 284 has a width w284 in the X direction that is smaller than the width w280.

In other words, the layout of FIG. 16 can be said to be an example in which a plurality of protruding portions 286 to 289 having different widths in the X direction is arranged in one element separation section 150. To be specific, the protruding portions 286 and 287 have the widths w281 and w282 in the X direction that are twice or more the width w280 of the element separation section 150 in the Y direction. The width w281 has a width in the X direction that is the same as the space between the adjacent beam columnar bodies 111 in the X direction. The protruding portion 288 has the width w283 in the X direction that is the same as the width w280. The protruding portion 289 has the width w284 in the X direction that is smaller than the width w280.

Like this layout, the widths of the recessed portions 281 to 284 or the protruding portions 286 to 289 in the X direction may be arbitrarily selected in consideration of structural strength and electrical resistance of the partial conductive layer 102'. Note that, in the example of FIG. 16, the widths of the recessed portions 281 to 284 or the protruding portions 286 to 289 in the X direction are different. However, the widths of all of the recessed portions and the protruding portions may be the same in the X direction. Further, electrical problems are not caused even if the recessed portion and the protruding portion are in contact with the beam columnar bodies 111 like the recessed portions 281 and the protruding portions 286.

Finally, a process of manufacturing the memory cell array 1 will be described.

Figure 17:
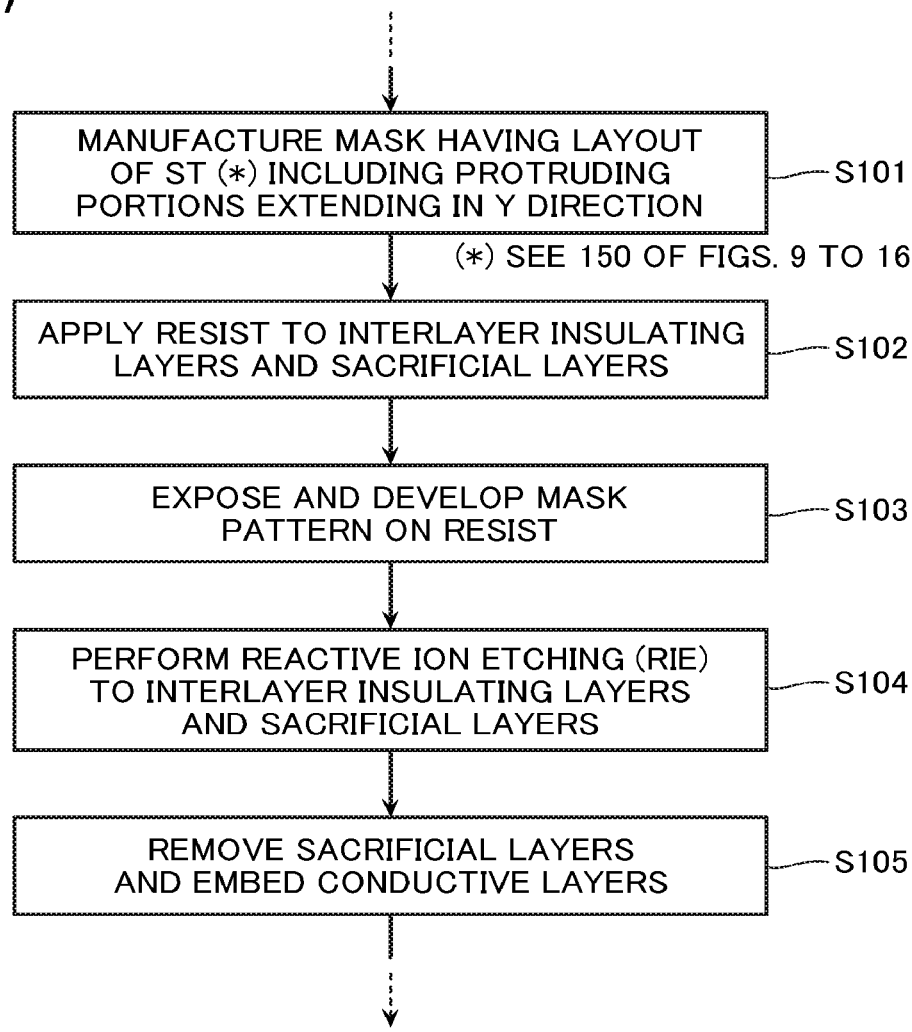
FIG. 17 is a flowchart of a process of manufacturing a memory cell array of a semiconductor memory device according to an embodiment.

FIG. 17 is a flowchart of a process of manufacturing the memory cell array of the semiconductor memory device according to an embodiment. FIG. 17 is a flow after the plurality of interlayer insulating layers 141 and sacrificial layers 161 are stacked above the semiconductor substrate 101, and end portions of these interlayer insulating layers 141 and sacrificial layers 161 are processed in a stepwise manner.

In step S101, a mask having the layout (see FIGS. 9 to 16) of the element separation section 150 (ST) having the protruding portions extending in the Y direction is manufactured.

In step S102, a resist is applied to the interlayer insulating layers 141 and the sacrificial layers 161. Here, the interlayer insulating layers 141 are formed of silicon oxide (SiO$_2$), or the like, for example. The sacrificial layers 161 are formed of silicon nitride (Si$_3$N$_4$), or the like, for example.

In step S103, the mask manufactured in step S101 is used, and exposure and development of a mask pattern to the resist applied in step S102 is executed.

In step S104, grooves 143 are formed in a stacked body of the interlayer insulating layers 141 and the sacrificial layer 161, by anisotropic etching such as reactive ion etching (RIE) using the resist processed in step S103.

In step S105, after the sacrificial layers 161 are removed through the grooves 143 formed in step S104, the conductive layers 102 are embedded in the places where the sacrificial layers 161 existed. Here, the conductive layers 102 are formed of tungsten (W), or the like, for example.

Following that embedding of the insulating layers 151 and the conductive layers 108 through the insulating layers 151 to side walls of the grooves 143 is executed, so that the memory cell array 1 is formed.

The above is apart of the process of manufacturing the memory cell array 1.

According to an embodiment, the conductive layers have the recessed portions narrowed in the Y direction, or the element separation sections have the protruding portions protruding in the Y direction, whereby the semiconductor memory device that suppresses the bend in the X direction of the wafer can be provided.

Note that the memory cell array 1 according to an embodiment may have a following structure, other than the structure illustrated in FIG. 3.

Figure 18:
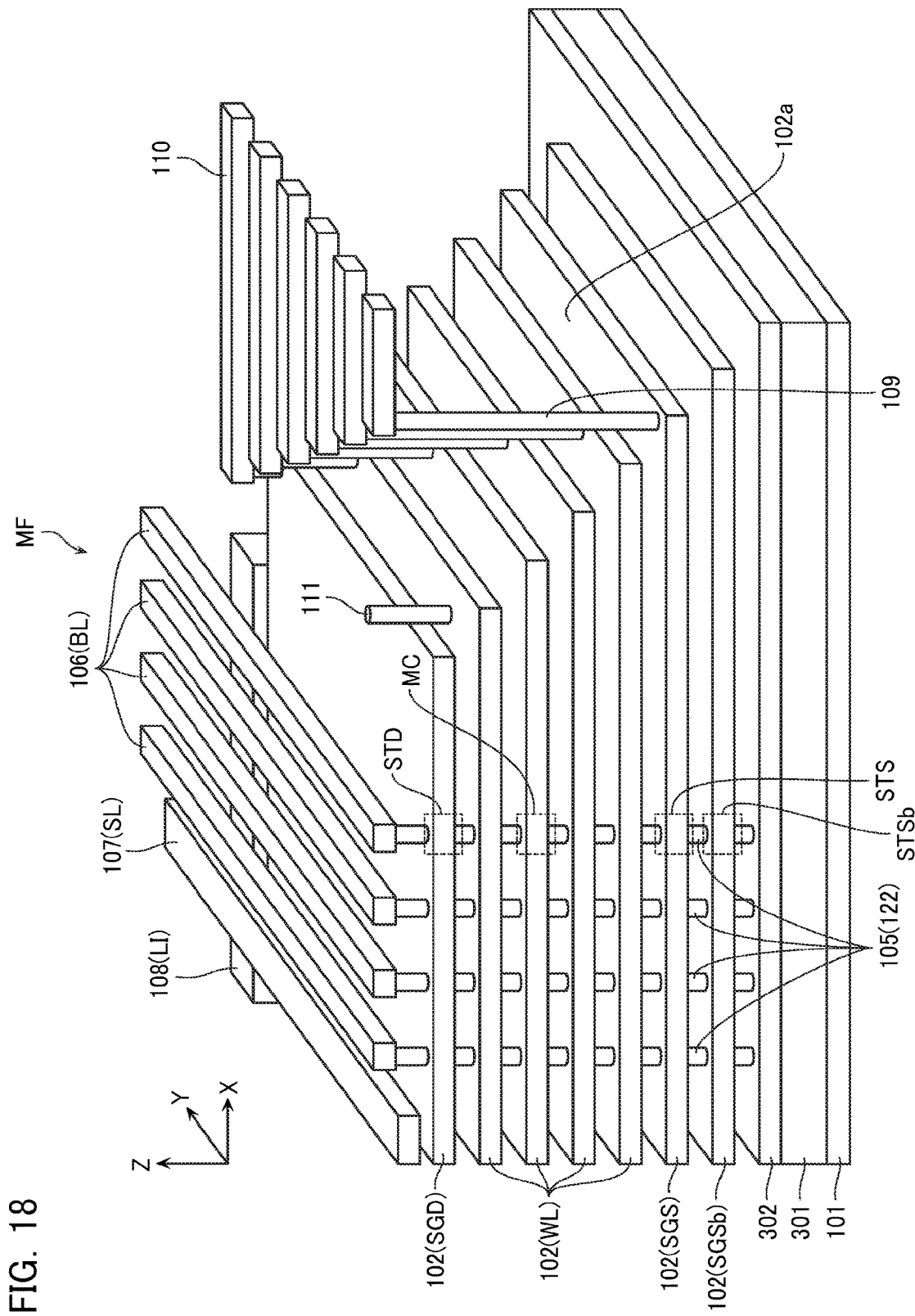
FIG. 18 is a perspective view illustrating another schematic structure of a memory cell array of a semiconductor memory device according to an embodiment.

FIG. 18 is a perspective view illustrating another schematic structure of the memory cell array of the semiconductor memory device according to an embodiment.

As illustrated in FIG. 18, in the memory cell array 1, a circuit layer 301 and a conductive layer 302 are arranged between the semiconductor substrate 101 and the lowermost conductive layer 102. The circuit layer 301 includes a field effect transistor (FET), a wire, and the like. The conductive layer 302 is formed of polysilicon (poly-Si), tungsten (W), or the like, for example. Further, the conductive layer 302 may be connected to lower ends of the memory columnar bodies 105 and the conductive layer 108 that functions as the source contact LI. Further, a semiconductor layer formed of silicon (Si), or an interlayer insulating layer formed of silicon oxide (SiO$_2$) or the like may be arranged in the memory cell array 1, in place of the semiconductor substrate 101, in addition to the structure illustrated in FIG. 18.

Some embodiments of the present invention have been described. However, these embodiments are presented as examples, and are not intended to limit the scope of the invention. These new embodiments can be implemented in other various forms, and various omissions, replacements, and changes can be made without departing from the gist of the invention. These embodiments and modifications are included in the scope and the gist of the invention, and are included in the invention described in the claims and its equivalents.

What is claimed is:

1. A semiconductor memory device comprising:
   an insulating layer;
   a plurality of conductive layers arranged above the insulating layer in a first direction, the conductive layers being arranged side by side in a third direction with a groove extending in a second direction interposed therebetween, the third direction intersecting with the second direction, each of the conductive layers having the second direction as a longitudinal direction and the third direction as a short direction, the conductive layers including a first conductive layer defined by first opposed grooves, at least one of the first opposed grooves including a first protruding portion extending in the third direction partially through the first conductive layer with a first remaining portion of the first conductor layer remaining between the first opposed grooves at said first protruding portion, a width of the first remaining portion in the third direction being shorter than half of a width in the third direction of the first conductive layer adjacent, in the second direction, the first protruding portion;

a channel semiconductor layer extending in the first direction; and a conductive wire arranged above the conductive layers in the first direction, the conductive wire extending in the third direction, and being electrically connected to the channel semiconductor layer.

2. The semiconductor memory device according to claim 1, wherein at least one of said first opposed grooves has a second protruding portion extending in the third direction partially through the first conductive layer with a second remaining portion of the first conductor layer remaining between the first opposed grooves at said second protruding portion, a width of the second remaining portion in the third direction being shorter than half of a width in the third direction of the first conductive layer.

3. The semiconductor memory device according to claim 1, further comprising:

a contact wire configured to electrically connect the first conductive layer and a wire arranged above the first conductive layer in the first direction, and a memory area in which the channel semiconductor layer is arranged and a contact area in which the contact wire is arranged, and the first remaining portion of the first conductive layer being arranged in the contact area.

4. The semiconductor memory device according to claim 2, wherein said first opposed grooves include plural of said protruding portions arranged in a same pitch in the second direction.

5. The semiconductor memory device according to claim 2, wherein said first opposed grooves include plural of said protruding portions arranged in a plurality of different pitches in the second direction.

6. The semiconductor memory device according to claim 2, wherein, said first and second protruding portions extend from the same groove of said first opposed grooves.

7. The semiconductor memory device according to claim 2, wherein, said first and second protruding portions extend from respective of said first opposed grooves.

8. The semiconductor memory device according to claim 7, wherein one of the first and second remaining portions is formed between opposed protruding portions extending from both said first opposed grooves.

9. The semiconductor memory device according to claim 1, wherein the conductive layers include a second conductive layer disposed between second opposed grooves adjacent to the first conductive layer in the third direction, at least one of the second opposed grooves including a second protruding portion extending in the third direction partially through the second conductive layer with a second remaining portion of the second conductor layer remaining between the second opposed grooves at said second protruding portion, a width of the second remaining portion in the third direction being shorter than half of the width of the second conductive layer in the third direction, and the first remaining portion of the first conductive layer and the second remaining portion of the second conductive layer are arranged in a linearly symmetrical layout aligned in the third direction.

10. The semiconductor memory device according to claim 1, wherein the conductive layers include a second conductive layer disposed between second opposed grooves adjacent to the first conductive layer in the third direction, at least one of the second opposed grooves including a second protruding portion extending in the third direction partially through the second conductive layer with a second remaining portion of the second conductor layer remaining between the second opposed grooves at said second protruding portion, a width of the second remaining portion in the third direction being shorter than half of the width of the second conductive layer in the third direction, and the first remaining portion of the first conductive layer and the second remaining portion of the second conductive layer are arranged in a same layout.

* * * * *